(12) United States Patent
Davis et al.

(10) Patent No.: US 6,554,128 B1
(45) Date of Patent: Apr. 29, 2003

(54) DIE SHUTTLE CONVEYOR AND NEST THEREFOR

(75) Inventors: Peter Davis, Santa Cruz, CA (US); Dean Tarrant, San Jose, CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 52 days.

(21) Appl. No.: 09/684,189

(22) Filed: Oct. 6, 2000

Related U.S. Application Data
(60) Provisional application No. 60/158,413, filed on Oct. 7, 1999.

(51) Int. Cl.[7] ............................................. B65B 47/00
(52) U.S. Cl. ............................. 198/468.4; 198/750.12; 198/471.1; 414/752.1
(58) Field of Search .................... 198/468.4, 750.12, 198/803.5, 471.1; 414/752.1, 226.01

(56) References Cited

U.S. PATENT DOCUMENTS

| | | | | |
|---|---|---|---|---|
| 3,300,063 A | * | 1/1967 | Jensen et al. ............... | 198/802 |
| 3,975,888 A | * | 8/1976 | Jones ......................... | 198/620 |
| 4,280,786 A | * | 7/1981 | Dyche ...................... | 198/464.3 |
| 4,971,515 A | * | 11/1990 | Pol et al. ..................... | 271/262 |
| 5,040,291 A | * | 8/1991 | Janisiewicz et al. .......... | 29/740 |
| 5,596,270 A | * | 1/1997 | Mitsui ...................... | 324/158.1 |
| 5,649,804 A | * | 7/1997 | Schychuck ............. | 198/750.11 |
| 5,671,530 A | | 9/1997 | Combs et al. | |
| 5,727,922 A | * | 3/1998 | Ikeya et al. ................ | 294/64.1 |
| 5,887,325 A | * | 3/1999 | Opfer ...................... | 198/346.1 |
| 5,976,306 A | | 11/1999 | Davis et al. | |

* cited by examiner

*Primary Examiner*—Christopher P. Ellis
*Assistant Examiner*—Richard Ridley
(74) *Attorney, Agent, or Firm*—Greenwald & Basch LLP; Duane C. Basch

(57) ABSTRACT

The present invention is a method and apparatus for use in a die feeder used in automated assembly machines and includes, among other aspects and features, a novel nest for holding a die against a vacuum port and releasing same without an independently controlled vacuum source. The invention also includes a novel elevator mechanism, employed to lift the nest to a pick location and means for positioning and aligning the nest for precision travel and pick location placement.

28 Claims, 8 Drawing Sheets

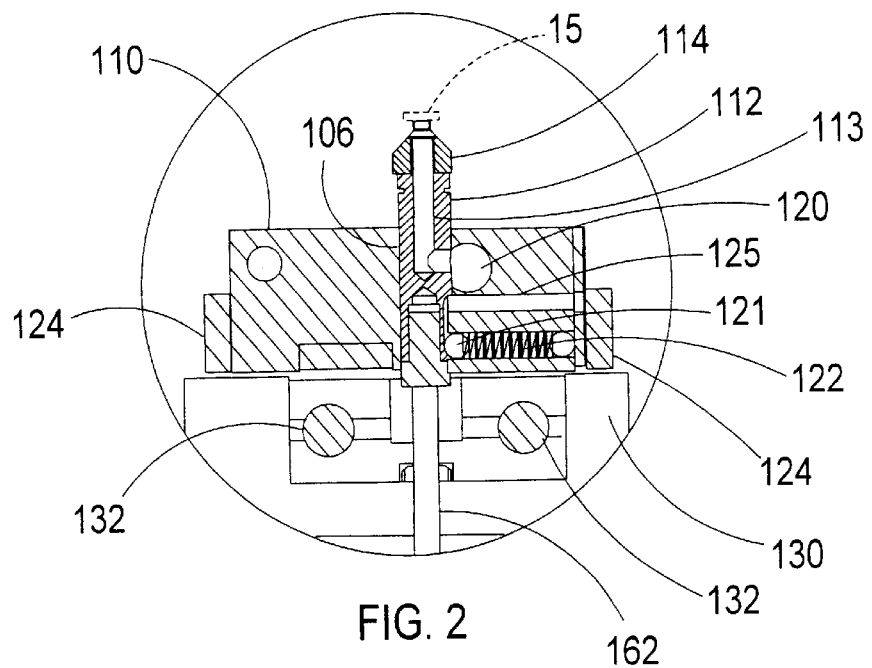
FIG. 2
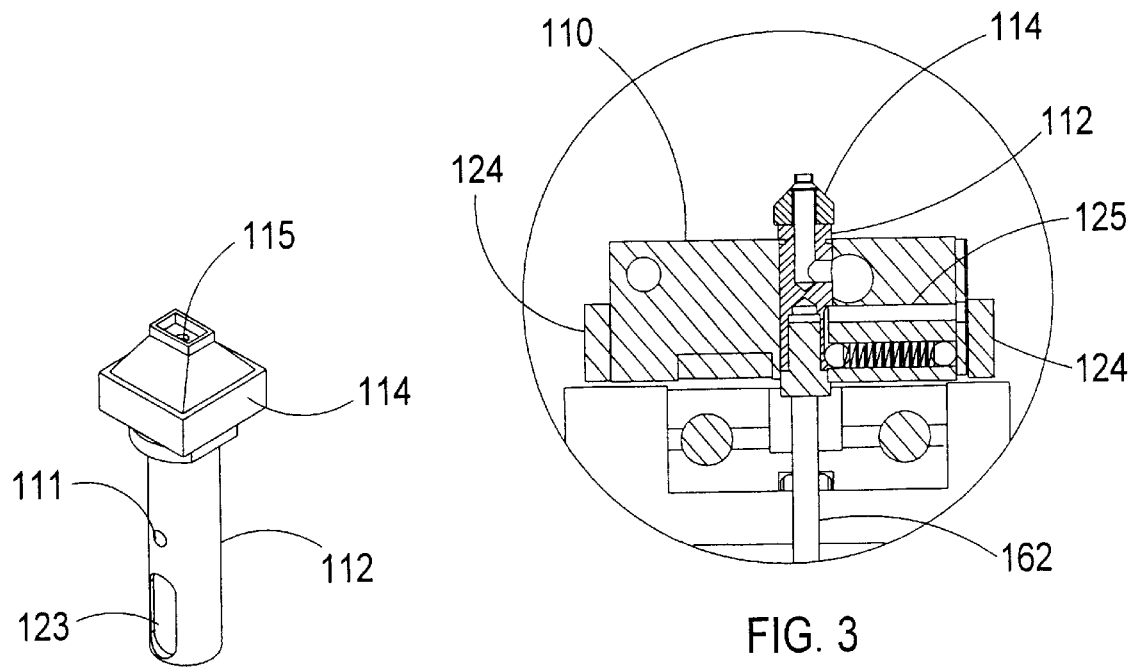
FIG. 1
FIG. 3

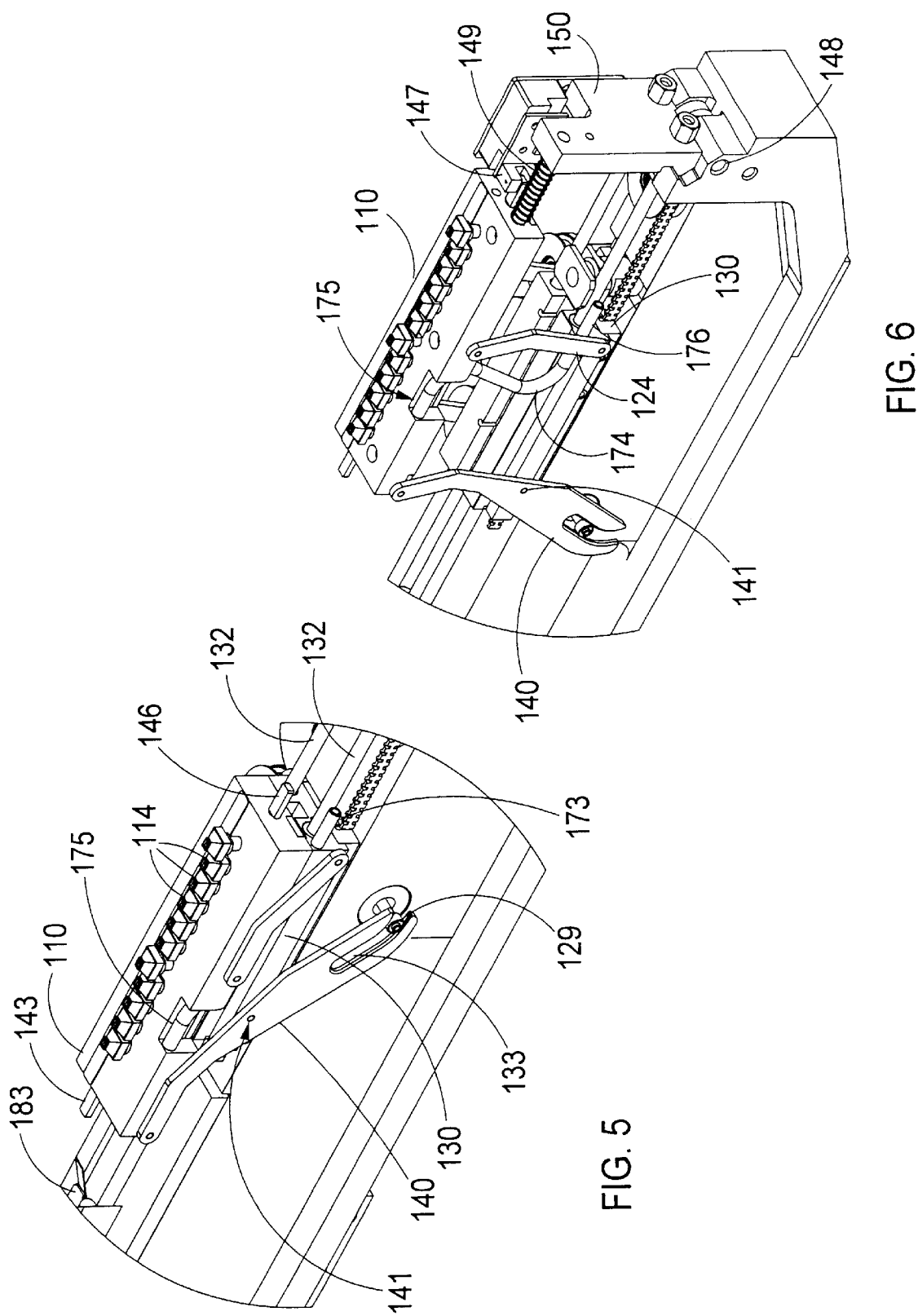

DIE SHUTTLE CONVEYOR AND NEST THEREFOR

INCORPORATION BY REFERENCE

Provisional Application for No. 60/158,413, filed Oct. 7, 1999, is hereby incorporated by reference for its teachings. Also incorporated herein by reference for their teachings are U.S. Pat. No. 5,976,306 issued Nov. 2, 1999, U.S. application Ser. No. 09/251,541 filed on Feb. 17, 1999, and WO 99/42289, all of which are assigned to the assignee of the instant application.

This invention relates generally to die conveyors used with automated pick-and-place equipment requiring the manipulation of numerous die at high speeds, and more particularly to a novel nest for holding a die against a vacuum port and releasing same without an independently controlled vacuum source, and an elevator mechanism employed to lift the nest to a pick location accessible by the host pick and place equipment.

BACKGROUND AND SUMMARY OF THE INVENTION

The present invention is an improvement of die or component conveyors used with automated pick-and-place equipment, particularly those systems requiring the manipulation and placement of numerous die or components at high speeds. The present invention includes, among other aspects and features, a novel nest for holding a die against a vacuum port and releasing it without an independently controlled vacuum source. The invention also includes a novel elevator mechanism, employed to lift the nest to a pick location and means for positioning and aligning the nest for precision travel and pick location placement.

This present invention is considered an improvement over die conveying systems for feeding die directly from a wafer to high-speed circuit board manufacturing equipment, including other direct die feeders. The prior direct die feeders generally rely on conveyor or belt transport technology to convey die to a pick location at the distal end of the feeder. In many applications, conveyors have proven to be unsatisfactory when conveying die or components having dimensions of less than about 1.0 millimeter. To overcome this problem, the present invention is directed to a high-speed shuttle transport system as a replacement to a conveyor or belt transport system as disclosed in the applications cited above. While the shuttle is capable of handling much smaller and larger die than the conveyor, it may not be able to match the throughput capabilities of a conveyor system. Thus, depending on the application, either a conveyor or shuttle may be a preferred apparatus.

In accordance with the present invention a shuttle unit preferably has two parts including a carriage and a shuttle nest assembly. As described herein, the shuttle nest carriage is slideably mounted on a pair of parallel rails extending the length of the feeder, and the shuttle nest traveling thereon is accurately positioned using a belt and pulley system and stepper motor as is well known for the movement of carriages in computer printers and scanners.

The shuttle nest assembly is generally brick-shaped and generally horizontally disposed over the carriage, and is mounted to the carriage by a plurality of pivotable links to permit the shuttle nest assembly to be elevated with respect to the carriage. The shuttle nest assembly also carries a plurality of nests disposed in a line. Each nest has an up position and a down position and can carry at least one die or component on an upper nozzle surface thereof. When in the up position, each nest's vacuum port is in communication with a vacuum source that is preferably a common vacuum source for all the nests.

When in the down position, the nest's vacuum port is disconnected from the vacuum and is in communication with atmospheric pressure. In operation, the nest is reset into the up position using pneumatically actuated reset pins or similar means so as to put the upper nozzle surface in a die receiving position and allowing the nest to be placed under vacuum, albeit open to atmosphere until a die is placed thereon. Once in the up position, the nest is ready to receive a die. When a die is placed in contact with the nest's vacuum port, the die will remain in place on top of the nest until the nest is pushed down, which vents the nozzle to atmosphere and release the vacuum, thereby releasing the die. It is contemplated that a pick and place machine of the type used in the manufacture of circuit boards will push the nest down, thereby releasing the die from the nest, as it is removing the die from the nest.

In accordance with the present invention, there is provided a die conveying apparatus in a die feeder, comprising: a fixed path in the die feeder, said path lying between a first location in proximity to a die source and a pick location at an end of the feeder; and a shuttle generally translating along said path for transporting die from the first location to the pick location, said shuttle carrying a plurality of nests, each of said plurality of nests being capable of holding a die thereon.

In accordance with another aspect of the present invention, there is provided a nest capable of holding a single die against a vacuum port on a surface thereof and releasing said die without requiring an independently controlled vacuum source, said nest comprising: a vertically disposed post; and a nest housing, wherein the post is mounted for vertical movement along a longitudinal axis of the post between an up position and a down position relative to said nest housing, said post having a continuous airway extending therethrough from a port at its upper end to an orifice on a side of the nest between the upper end and a lower end thereof, and when said post is in the up position said orifice is aligned with a passageway communicating with the vacuum source so as to produce a vacuum at the port, and when said post is in the down position, said orifice is disengaged from the vacuum source and the airway communicates with air at atmospheric pressure, thereby releasing the die from the port.

In accordance with yet another aspect of the present invention, there is provided a die conveying apparatus in a die feeder, comprising: a fixed path in the die feeder, said path being a linear path between a first location in proximity to a die source and second location in proximity to a pick location at an end of the feeder; a shuttle carriage, slidably connected to said fixed path and traveling therealong; and a shuttle operatively associated with said shuttle carriage, wherein said shuttle is conveyed along a non-linear path as the carriage travels along the fixed path, thereby transporting die from one of a plurality of shuttle positions adjacent the die source to the pick location, said shuttle carrying a plurality of nests, each of said plurality of nests being capable of holding a die thereon.

One aspect of the invention is based on the discovery of techniques for independently controlling the application of a vacuum source to individual die nests based upon a position of the nest, and the transport of die from a placement location to a pick location. The techniques enable the use of a shuttle die transport system as a replacement for convention conveyor or belt-type systems. Because of the accuracy of placement, and the retention of die on a shuttle nest using vacuum, the system is highly accurate and increases the pick-up efficiency of the assembly machine to which components are being fed. Moreover, the novel vacuum valving design enables to shuttle to be constructed without an elaborate valve control system, saving both cost and precious space in the die feeder.

BRIEF DESCRIPTION OF THE DRAWINGS

FIG. 1 is an isometric view showing a nest post having an interchangeable rubber tip on top for capturing a die;

FIG. 2 is a cross-sectional view of the nest in the up position in accordance with an aspect of the present invention;

FIG. 3 is a cross-section view of the nest in the down position;

FIG. 5 is a detailed perspective view of the shuttle nest in the transport position;

FIG. 6 is a detailed perspective view of the shuttle nest in position at the pick location;

Figure 4:
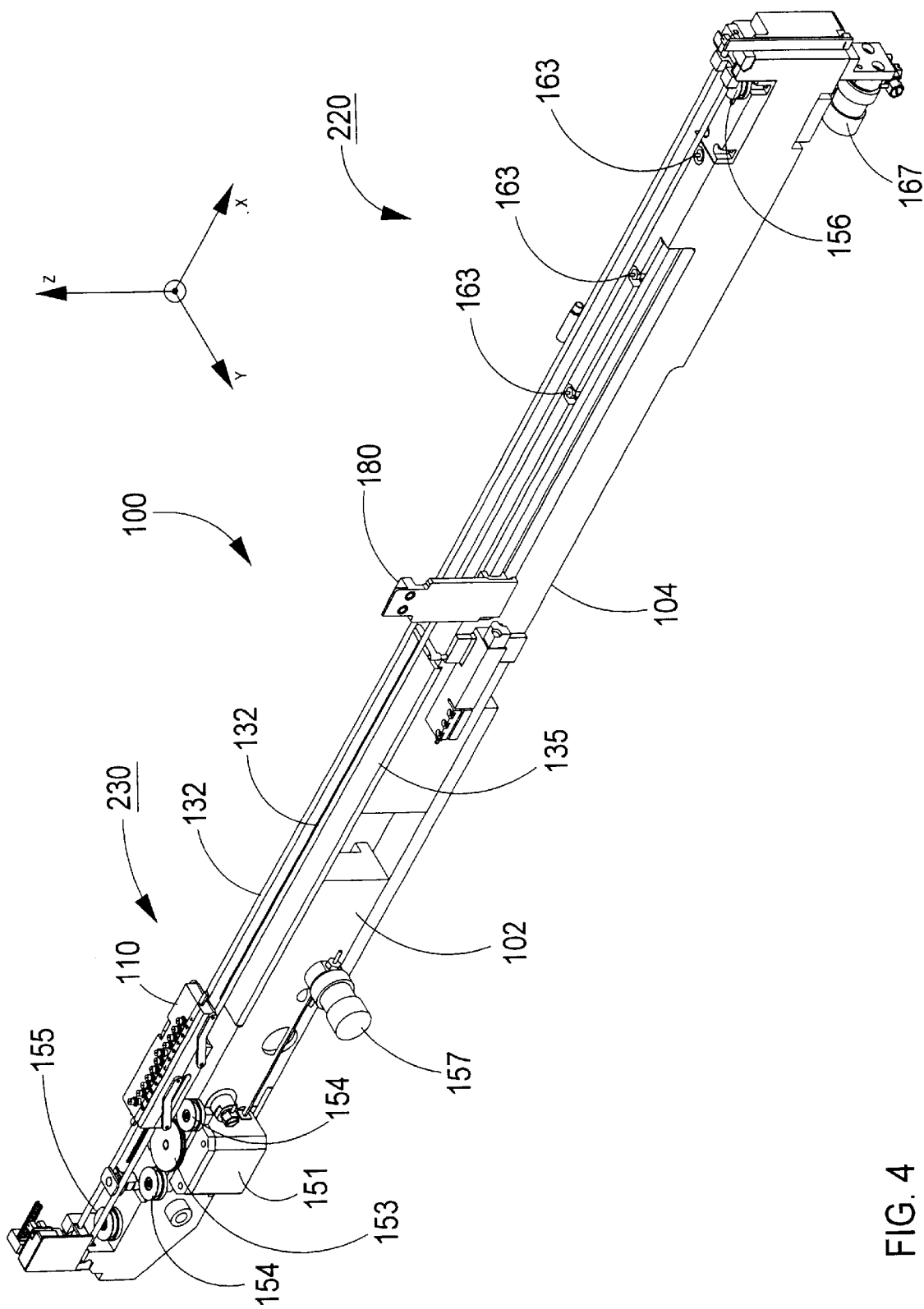
FIG. 4 is an isometric view of a shuttle transport for a die feeder having a shuttle with a plurality of nests.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements. In describing the present invention, the following term(s) have been used in the description.

Referring to FIGS. 1–3, nest 112 is vertically mounted in a shaft 106 formed in shuttle nest assembly 110. Nest 112 preferably includes an interchangeable tip or nozzle 115 made of rubber, polymer or similarly conformable material, for accommodating die of various sizes thereon. Additionally, nest 112 includes an airway or passage 113 providing a continuous channel by which air may pass between port 115 at the nozzle and side-hole or orifice 111. When the nest is in the up position relative to the nest assembly, the placement of the side orifice 111 is such that the port is in communication with a common vacuum source (not shown) as applied to airway 120 as shown in FIG. 2. When the nest 112 is in the down position relative to nest assembly 110, orifice 111 is placed adjacent airway 125, and port 115 is thereby placed in communication with atmospheric pressure via passage 125 as shown in FIG. 3.

A detent or similar mechanism, such as a spring biased ball 121 engages recess or groove 123 in nest 112 (shown in FIG. 1) thereby frictionally-holding the central post of nest 112 in either its up or down position. It will be appreciated that the frictional bias of ball 121 caused by spring 122 may be sufficient to retain the post in the up or down position. However, it will be further appreciated that the groove 123 may also contain a deeper depression at the top and bottom thereof corresponding with the preferred placement of the nest and orifice 111.

Nest 112 is preferably machined from a stainless steel or similar metallic stock, so as to provide the required properties of static dissipation, mass, etc. that are required to accurately retain and maintain the die in a desired position during transport form a placement location to a pick location. Nest 112, or selected portions thereof, may be coated with Teflon (PTFE) or a similar friction-reducing coating so as to assure that nest 112 will be able to move between its up and down positions over numerous cycles. The nest assembly block 112 is preferably formed from a carbon-filled thermoplastic so as to allow for the block to assist in the dissipation of static electricity from the nest to a system ground (described below) as well as molding/machining to add shafts 106 and airways 120 and 125. The preferred nest assembly block material is made of plastic material and includes approximately 30% carbon fill.

Figure 7:
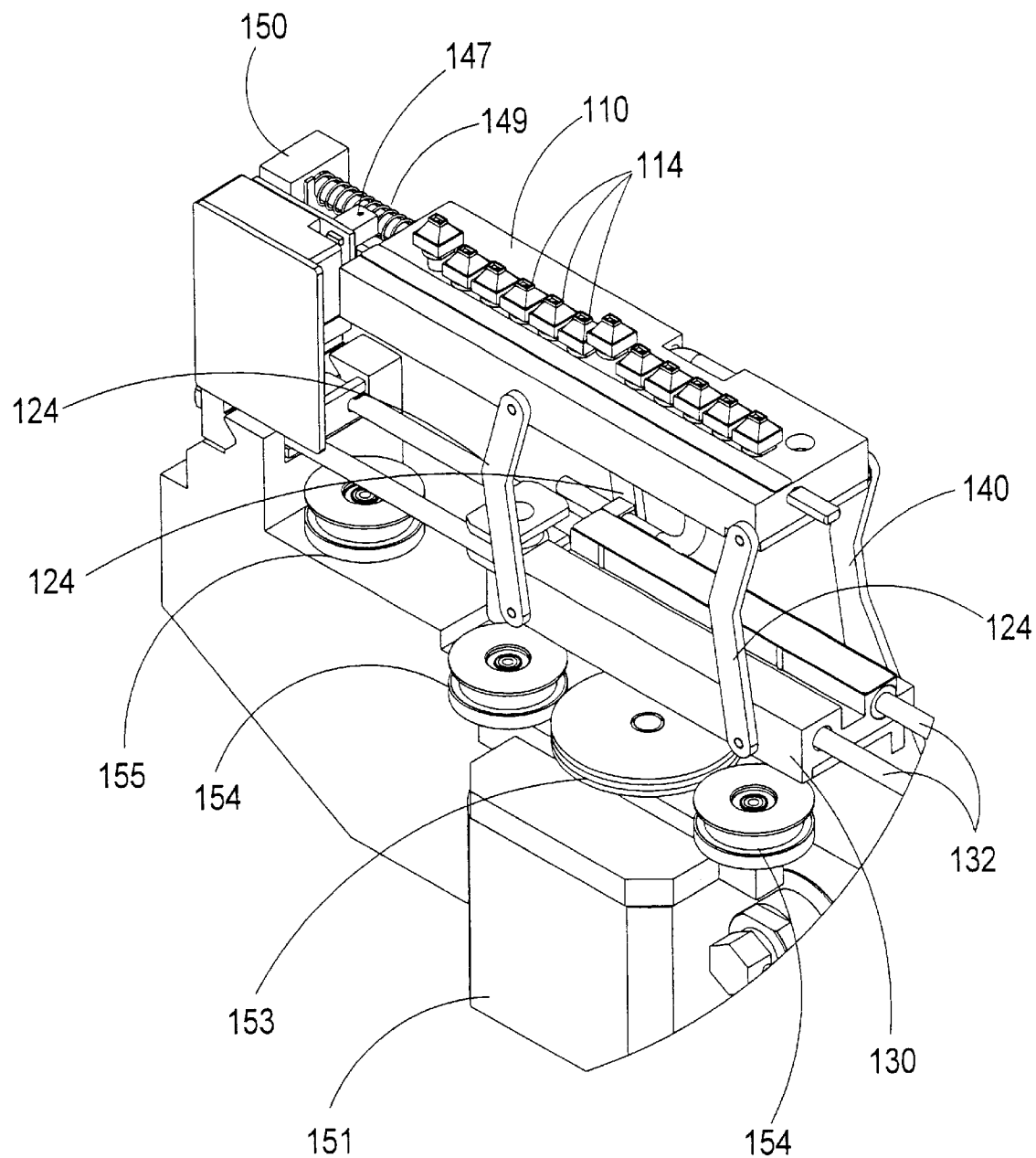
FIG. 7 is a detailed perspective view of the shuttle in the pick location from a viewpoint opposite that of FIG. 6 and also shows the drive motor and pulley system for positioning the nest carriage.

Referring now to FIG. 4, there is depicted a perspective view of the transport assembly 128 that would replace a belt-based conveyor system in a traditional direct die feeder. Within the transport assembly, nest assembly 110 is connected to a carriage (FIGS. 6 and 7; 130) that travels along rails 132 and is accurately positioned longitudinally thereon using a stepper motor 151 and belt and pulley system 153, 154, 155 and 156 (belt not shown) as is well-known in carriage placement systems including ink jet printers and digital scanners to position print or scan heads, respectively.

For accurate positioning of the shuttle carriage, the motor may be switched between an incremental mode that enables fast driving of the shuttle carriage, and a microstep mode that enables precise positioning of the shuttle carriage. Microstepping is preferably used in two instances. First, microstepping is used when calibrating the home position of the shuttle with respect to the x-axis (longitudinal axis) of the transport, specifically the pick and flip heads of a die extractor as disclosed in Applicant's prior applications referenced above and incorporated by reference. Secondly, since the incremental motion is much grosser than microstepping, microstepping is used at both the die placement and pick locations, generally near the ends of the shuttle transport path, to.place the shuttle precisely at its presentation point. Furthermore, the x-axis machine of the die placement equipment is used to position the die precisely on the selected nest on the shuttle without requiring the shuttle to microstep into position under the pick head or flip head.

Rails 132 are placed in tension to improve their stiffness and to reduce the deflection of the shuttle and carriage as they traverse the rails. More specifically, the rods are preferably maintained in tension so as to reduce the deflection thereof, and enable transverse alignment of the rods relative to a die source 108. Moreover, rods provide a reduced geometry and further enable a lower mass carriage to be employed while enabling higher carriage speeds as the shuttle translates along the length of the essentially linear path defined by the rods. To prevent the whole shuttle conveyor unit 100 from bending under the tension applied to rails 132, a counter-tensioning system is employed as is shown in FIG. 4. The frame of shuttle conveyor 100 is divided into a loading portion 104 and a presentation portion 102. Connecting the two portions together is flexure 135 such as a piece of rolled steel, which is designed to bend or flex in the z-direction in response to an imbalance of bending stresses. To balance the bending stresses caused by the tension in rails 132, a turnbuckle or similar adjustment mechanism 139 is provided which is configured to be placed in tension and draw plates 136 and 137 toward each other. Since flexure 135 is between turnbuckle 139 and rails 132, balancing of the tensions results in placing the flexure in simple compression, allowing the shuttle conveyor unit to lie flat.

In addition to the counter-tensioning arrangement, it will be appreciated that the rods may also be subject to vibration due to external forces imparted to the shuttle transport system or the die feeder with which it is associated. Accordingly, the present invention contemplates a support or damping member 197 (FIG. 10) that may be used to support or engage a lower surface of rods 132 when the shuttle/carriage are not traversing the path defined by the rods. Such a support may be mechanically or pneumatically activated, or may simply be used during storage and shipping of the shuttle transport to avoid having to readjust the system.

Reset pins 163 are actuated pneumatically via solenoid 167 to push the nests within the shuttle assembly into an up position. In particular, the pins are located at one of three possible die placement positions adjacent a die source 108. A plurality of positions are preferred so that the shuttle may be placed at a location that minimizes the travel, and time, of the die placement device (see U.S. Pat. No. 5,976,306, previously incorporated by reference.)—thereby improving the overall efficiency of a combined shuttle transport and die placement system. Although this embodiment provides only three reset pins actuated with a single solenoid, the invention is not limited to this configuration. Any number of independently actuated reset pins or an elevated ramp in a similar position may be provided, e.g., to accommodate larger shuttles and faster resets of the desired nest. When a nest post is positioned so as to be vertically aligned over the nearest reset pin, pneumatic solenoid 167 is actuated, driving pressurized air or a vacuum to pistons (not shown) connected to pins 163, causing them to move up. The pin under a post passes through pin shaft 162 (shown in FIGS. 2 and 3) to push nest 112 upward to its up position, thereby placing corresponding port 115 in communication with vacuum source 120.

In operation with a die extraction means (e.g., Applicant's Direct Die Feeder, disclosed above and incorporated by reference); the nest reset operation occurs concurrently with the die extraction process, so no time is lost resetting the pins one by one. Also, by resetting the pins one by one, rather than all at once, less vacuum air is required to maintain sufficient vacuum at any one port. In other words, if all the nests were in their up position and void of die, a larger air flow would be required to maintain sufficient vacuum to hold the first die in place. By resetting each nest prior to placing a die on it, the only air flow required is sufficient air flow through that single port to maintaining sufficient vacuum on all the other ports to retain their die. Alternatively, as suggested by the ramp or multiple reset pin embodiments, all of the nests within a shuttle assembly could be moved to the up (vacuum "on") position, where those not covered with a die placed on the nozzle would provide an opening to ambient air and a reduction in the amount of vacuum applied to any particular nozzle.

As disclosed with respect to the Direct Die Feeder patent, a machine vision camera may be employed to determine the location of die on an expanded wafer from which they are removed for placement on the nest. In an embodiment of the present invention, the same machine vision camera may be utilized to improve the positioning of the pick head and retrieved die or component relative to the nest. In other words, the vision camera may be employed not only to assist in positioning the head for retrieval of the die from the wafer, but also to assist in the placement of the die on the nest, thereby assuring accurate placement of the die in a manner that is generally centered over a nest.

The present invention is not limited to a shuttle carrying twelve nests as depicted in the drawings, and shuttle assembly 110 may carry any number of nests. Furthermore, there is no requirement that all the nests be used at any particular time. For example, if the dies to be conveyed are larger than the spacing between the nests, every other, every third, or every fourth, etc., nest may be employed. Since the nests not carrying the die are slightly higher than the die-carrying nests, the unused nests will not interfere with the operation of the die-carrying nests. This operation allows the shuttle conveyor to be suitable for use with very large, as well as very small die.

Due to design constraints of some pick-and-place assembly machines, it is necessary avoid travel through what is referred to as a "no fly zone" through which the pick-and-place robotic head moves, and to elevate the nests near the pick location in order to reach a pick position. A solution to this problem is shown with reference to FIGS. 5, 6 and 8. As shuttle carriage 130 approaches the pick location cam pin 129 extends by actuation of pneumatic solenoid 157 (shown in FIG. 4). Link 140, with extended j-cam 133 captures extended j-cam pin 129 causing, link 123 to rotate in a clockwise direction about pivot point 141 as seen in FIGS. 5 and 6. The remaining three elevator links. 124 are also caused to rotate when link 123 lifts its corner of the shuttle nest assembly 110. The final positioning is accomplished through the use of a bullet-nosed pin 149, shown in FIG. 6. Pin 149 extends either from the nest assembly into a hole in end-plate 150 or from end-plate 150 into a hole in nest assembly 110. A coil spring is provided around bullet-nosed pin 149 to cushion the contact between the pin and its stop (either shuttle nest assembly 110 or end-plate 150) and prevent backlash. End-plate 150 is adjusted on the y-axis via set screw 148 for shuttle nest placement calibration purposes (described below), and a similar adjustment is preferably available at the other end of the rails so that the position and path of the shuttle nest is somewhat independent of the feeder in which it resides.

As described above, the pin 149 contacts end plate 150, or a similar mechanism at the other end of the rails or rods 132. In addition to providing a travel limit for the shuttle along its path, the pin also provides a means for grounding the shuttle assembly while it is in the die placement location of the pick location. Because the nests 112 are metallic, and.are maintained with a shuttle assembly 110 made of a composite including carbon fibers, any static charge that might be built up on the die of the shuttle assembly is dissipated before the die is handled.

As further illustrated in FIG. 6, sensor 147, which may be optical, inductive, or similar position-sensing device, confirms the position of the shuttle. In the case of an optical sensor, the position of the shuttle at its pick point is confirmed when tab 146 passes between emitter and detector portions of sensor 147. Tab 143 serves an equivalent function at the other end of shuttle conveyor so as to confirm the shuttle nest's location at the die placement position.

Figure 8:
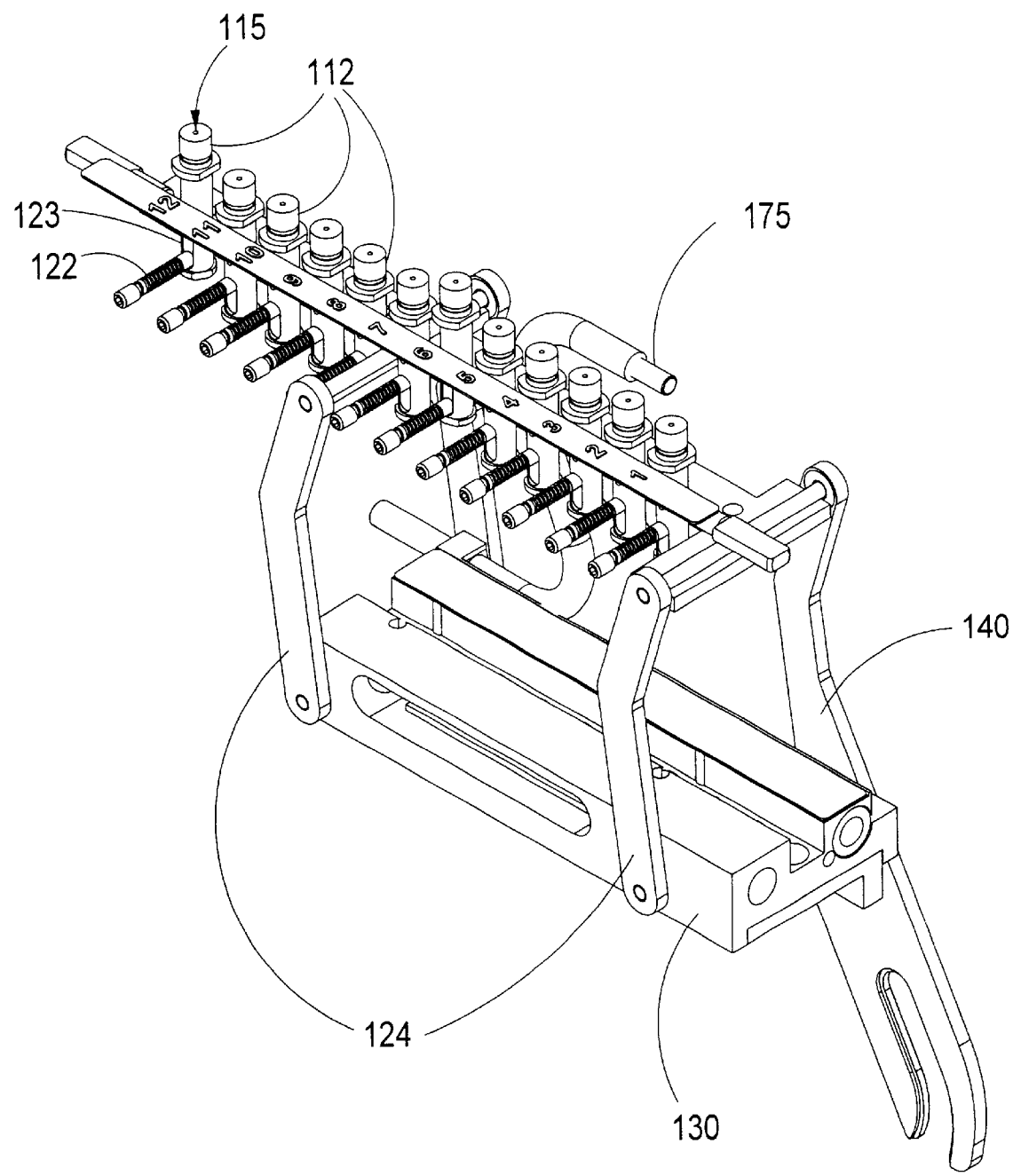
FIG. 8 is a cutaway illustration of the nest assembly of FIG. 7, showing the detail of the nests.

Referring to FIG. 8, vacuum is introduced to space 120 in the shuttle nest assembly 110 by surgical vacuum tubing 174 shown in FIG. 6 connected to the shuttle block assembly via nipple 175. Tubing 174 is connected to one end of nipple 176 mounted on carriage 130. To the other end of nipple 176 tubing (not shown) is connected to a vacuum source. J-cam pin 129 retracts to permit a loop of the additional vacuum tubing to pass by without interference as the shuttle and carriage travel away from the pick location and toward the die placement location.

Figure 9:
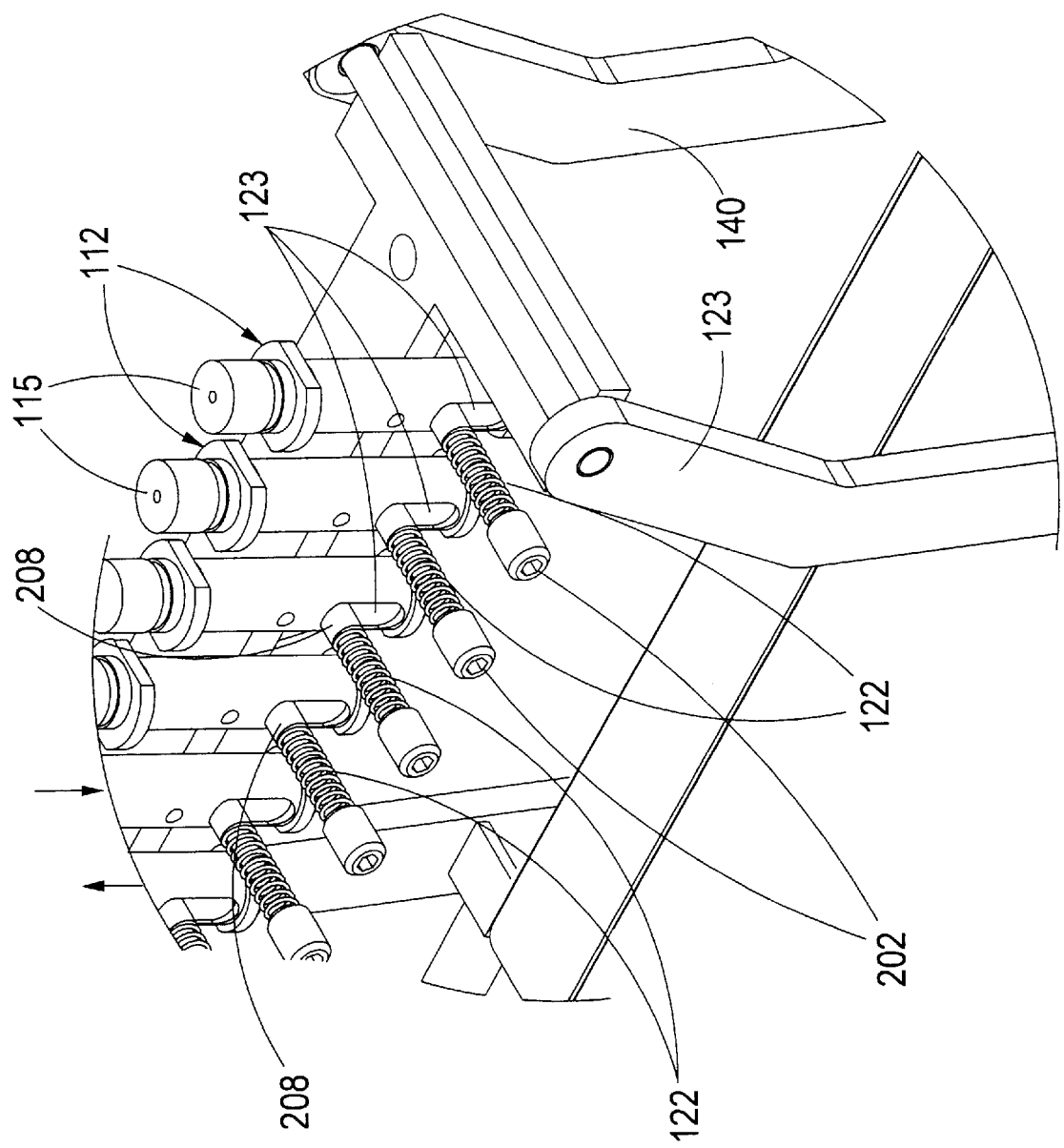
FIG. 9 is a magnified cutaway view of a portion of the nest assembly in FIG. 8.

Referring now to FIG. 9, there is depicted an alternative embodiment for nests 112 and the detent mechanism. In particular, the mechanism for limiting the travel and rotation of the nest 112 comprises a flat-ended shaft 208 that is biased by spring 122 so as to bear against the groove or recess 123. As will be appreciated, the amount of bias may be controlled by a hex screw 202 or equivalent adjustment mechanism being inserted or withdrawn from a tapped hole in the shuttle assembly 110 (not shown in FIG. 9). It will be further appreciated that in order to assemble or disassemble the shuttle assembly, the screw 202, the spring 122 and the shaft 208 must be removed from the assembly, or at least retracted from the nest shaft 106.

Figure 10:
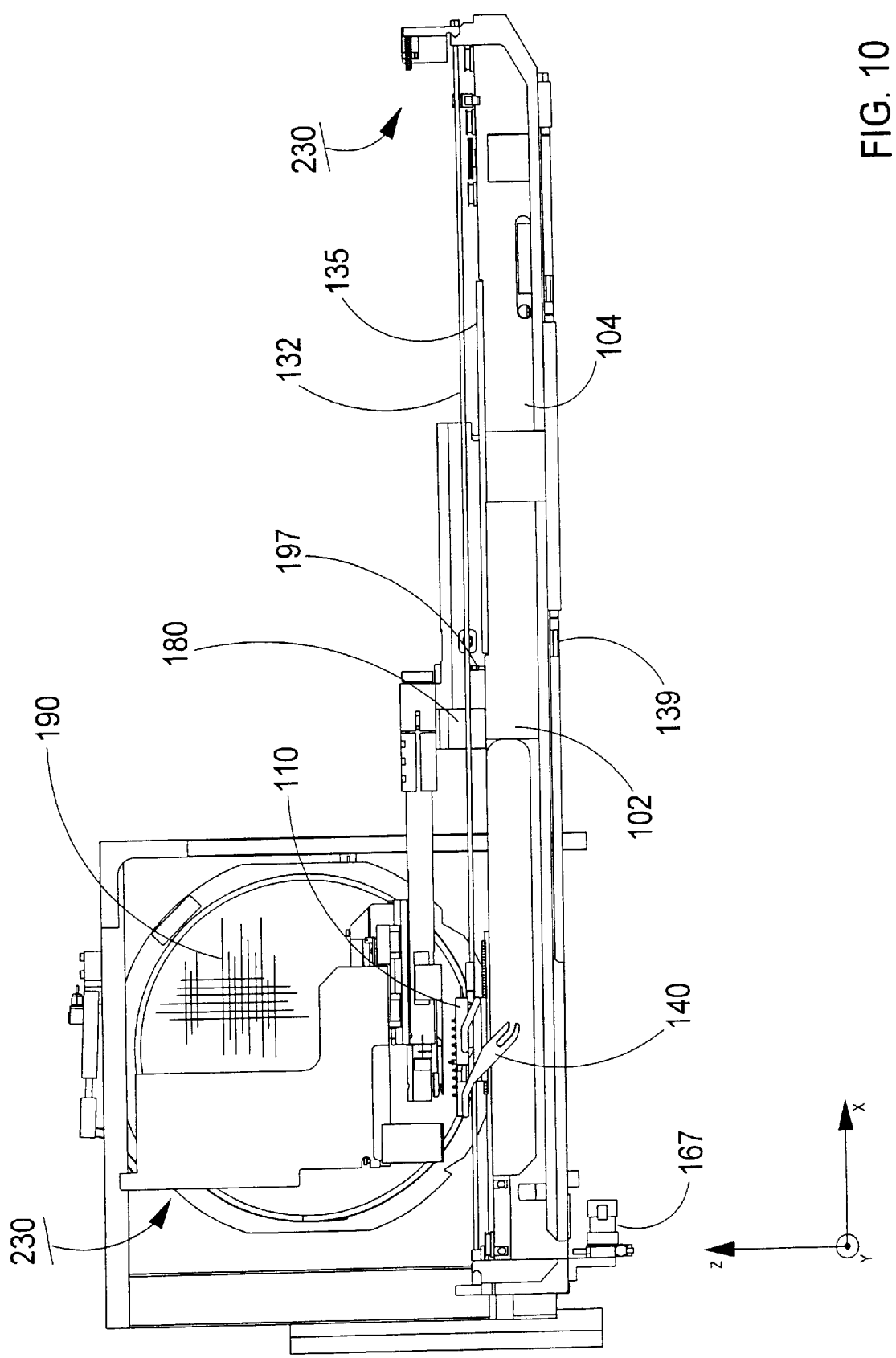
FIG. 10 is a plan view of the shuttle transport of the present invention, including detail relative to adjustment of the apparatus.
Figure 11:
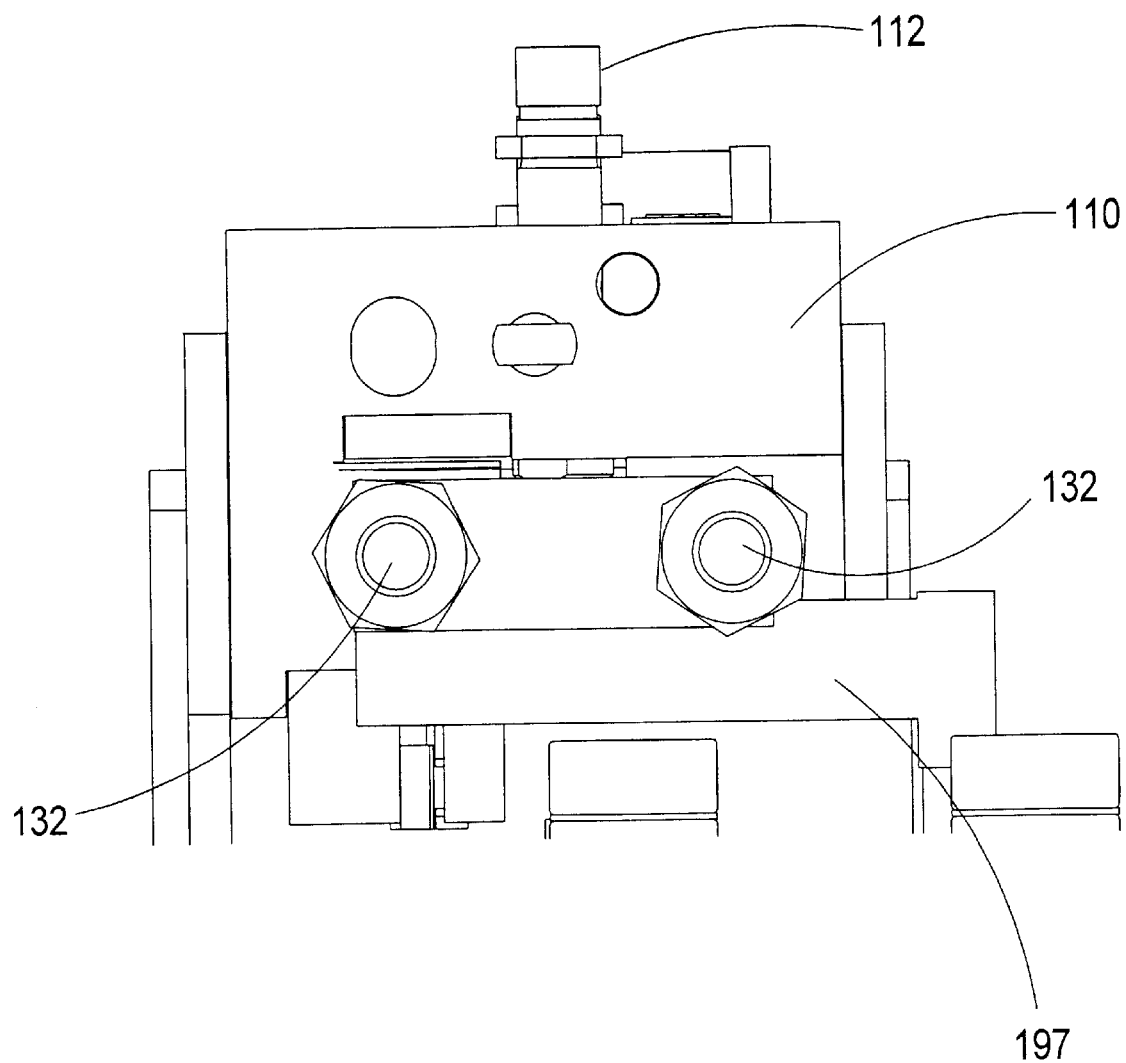
FIG. 11 is an end view of the shuttle transport.

Referring lastly to FIGS. 10 and 11, depicted therein is a plan view of the conveyor in accordance with an embodiment of the present invention. In operation, the shuttle transport is indexed (microstepping as described above) to facilitate the placement of die thereon when the shuttle/carriage is in the region denoted 220. (see also FIG. 4). Once the shuttle nests are loaded with die, the shuttle transports the die, as described herein, to position 230, where the die are elevated by the action of the j-cam and presented at the pick location. Upon retrieval of all the die, the shuttle nests are all "pushed" to a down position, and the shuttle is transported back to region 220. However, in order to assure the accuracy of the placement of the shuttle, the carriage is preferably moved until the shuttle is sensed at a home position, as described above, and then microstepped to the die placement position to begin another cycle. As one knowledgeable about the placement and retrieval of electronic die will appreciate, the positioning of the die, and therefore the transport, must be very accurate and repeatable.

As a result of the critical positioning and accuracy required, the shuttle transport system is preferably leveled and adjusted, after completion of assembly, on a granite gauging table or similarly stable and flat surface. After attaching the shuttle transport to the gauging block, the guide rods 132 should be placed in a loose condition where there is no tension applied. Next, the turnbuckle 139 should be tightened to a significant extent using a hand wrench. Referring to FIG. 11, a dial indicator should then be used to check the position of flexure or connecting beam 135 at the outmost ends thereof. The measurement should not vary by more than 0.0002 inches from end-to-end.

Next, the rods should be hand tightened and the deflection of the rods, dependent upon the tension, should be 0.030 inches @ 0.075±0.005 pounds force as measured using a force gauge (Chatelion). The rods may be tightened or loosened (increased tension or decreased tension) so as to achieve the desired deflection. Once the rod tension is set, the position of the flexure or connecting beam 135 should again be measured to determine if it is within tolerance. If not, the turnbuckle 139 may be adjusted so as to move the flexure. As will be appreciated, it may be necessary to iterate turnbuckle, rod adjustment steps in conjunction with monitoring the position of the flexure so as to achieve the desired configuration.

Once the rods and turnbuckle are within specification, the position of the shuttle at the front and rear of the transport may be adjusted by adjusting the front rod adjustment via adjustment screw 148 (FIG. 6). Preferably, the position of the shuttle, front to rear is within ±0.003 inches. It will be understood that the position of the rods, which define the path of shuttle travel, must be aligned with the die placement device within the feeder in order to assure accurate placement of die on the nests at any of the one or more die placement positions. Accordingly, the rods may be adjusted transversely, enabling collinear die source adjustment/alignment over the plurality of die source or placement positions.

Subsequently, the swing support 197 is engaged so as to support the bottom of rods 132, and the deflection of the rods from the shuttle to the support position should be ±0.0005 inches, otherwise, the height (y-direction) of the swing support may be adjusted to complete the transport set-up procedure.

In recapitulation, the present invention is a method and apparatus for a novel nest for holding a die against a vacuum port and releasing same without an independently controlled vacuum source, and an elevator mechanism employed to lift the nest to a pick location accessible by host pick and place equipment.

It is, therefore, apparent that there has been provided, in accordance with the present invention, a method and apparatus for the conveyance of die or similar components at high speeds in a die feeding system. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. A die conveying apparatus in a die feeder, comprising:
   a path in the die feeder, said path lying between a first location in proximity to a die source and a distal pick location at an end of the feeder; and
   a shuttle for transporting die, said shuttle generally reciprocating along said path between the die source location and the distal pick location, said shuffle carrying a plurality of nests, each of said plurality of nests being capable of holding a die thereon.

2. The apparatus of claim 1, wherein said shuttle is operatively connected to a motor capable of stopping said shuttle at one of a plurality of die source locations, so as to adapt to a die position for maximum process efficiency.

3. A die conveying apparatus in a die feeder, comprising:
   a path in the die feeder, said path lying between a first location in proximity to a die source and a pick location at an end of the feeder; and
   a shuttle generally translating along said path for transporting die from a die source location to the pick location, said shuttle carrying a plurality of nests, each of said plurality of nests being capable of holding a die thereon, wherein said plurality of nests are connected to a common vacuum source, and where each nest is independently capable of holding a die under vacuum and releasing the die without independent control of the vacuum source.

4. The apparatus of claim 3, wherein each of said plurality of nests may be placed in an up position and a down position and where the nest is connected to the common vacuum source only when in the up position.

5. The apparatus of claim 4, wherein each of said plurality of nests is disconnected when the nest is pushed downward so as to move the nest from the up position.

6. The apparatus of claim 4, wherein said nests are placed in the up position by contact with a pin on the bottom thereof, and where said nests are placed in the down position by the force of a pick head as the pick head retrieves the die from the top surface of said nest.

7. The apparatus of claim 4, wherein said nests are placed in the up position by contact with a ramp device that pushes said nests upward as the shuttle moves longitudinally along said path, and where said nests are placed in the down position by the force of a pick head as the pick head retrieves the die from the top surface of said nest.

8. The apparatus of claim 1, wherein said path is fixed and is comprised of a pair of parallel rods.

9. The apparatus of claim 8, wherein the position of each of said pair of parallel rods, relative to the die feeder, is adjustable.

10. The apparatus of claim 9, wherein the position of each of said pair of parallel rods is adjustable in a transverse direction, enabling collinear die source adjustment at a plurality of die source positions along said path.

11. The apparatus of claim 8, wherein said rods are maintained in tension so as to reduce the deflection thereof as the shuttle translates along the length of said rods.

12. The apparatus of claim 8, wherein said rods are maintained in tension so as to enable transverse alignment to the die source as the shuttle translates along the length of said rods.

13. The apparatus of claim 8, wherein said rods are maintained in tension so as to enable the use of a low mass carriage as the shuttle translates along the length of said rods.

14. The apparatus of claim 11, further including a support member adjacent a lower surface of said rods, wherein said support member may engage the lower surface thereof to counter the deflection thereof.

15. A die conveying apparatus in a die feeder, comprising:
a path in the die feeder, said path lying between a first location in proximity to a die source and a pick location at an end of the feeder; and
a shuttle generally translating along said path for transporting die from a die source location to the pick location, said shuttle carrying a plurality of nests, each of said plurality of nests being capable of holding a die thereon, wherein said shuttle further comprises:
a carriage slidably affixed to said path;
a drive system for moving said carriage along said path; and
a nest assembly operatively associated with said carriage, said nest assembly being movable in at least one direction relative to said carriage, and including a plurality of nests, each of said plurality of nests being capable of holding a die thereon.

16. The apparatus of claim 15, wherein said shuttle further comprises a static charge dissipation means so as to discharge any static electricity that may be built up during transport of the dies thereon.

17. The apparatus of claim 1 wherein said shuttle further includes:
a carriage for translating along said path; and
a nest assembly,
said carriage carrying said nest assembly and said nest assembly carrying said plurality of nests, said nest assembly being disposed generally above said carriage and connected to said carriage by, a plurality of pivotable links that allow said nest assembly to be elevated with respect to said carriage, at least one of said links being an extended link with a j-cam extending from its lower portion configured, to engage a pin causing said extended link to rotate as said carriage travels along the path towards said presentation point, and further, the rotation of said extended pin causes said nest assembly to elevate with respect to said carriage.

18. The apparatus of claim 9, wherein the position of each of said pair of parallel rods is adjustable in a transverse direction, enabling collinear die source adjustment at a plurality of die source positions along said path, and where the die source includes a machine vision system for the alignment of the die source with at least one of said plurality of nests.

19. A die conveying apparatus in a die feeder, comprising:
a path in the die feeder, said path being a linear path between a first location in proximity to a die source and second location in proximity to a pick location at an end of the feeder;
a shuttle carriage, slidably connected to said path and traveling therealong; and
a shuttle operatively associated with said shuttle carriage, wherein said shuttle is conveyed along a non-linear path as the carriage travels along the linear path, thereby transporting die from a first location in proximity to the die source to the pick location, said shuttle carrying a plurality of nests, each of said plurality of nests being capable of holding a die thereon.

20. The apparatus of claim 19, wherein said path is adjustable relative to the die source.

21. The apparatus of claim 19, wherein said plurality of nests are connected to a common vacuum source, and where each nest is independently capable of holding a die under vacuum and releasing the die without independent control of the vacuum source.

22. The apparatus of claim 21, wherein each of said plurality of nests may be placed in an up position and a down position and where the nest is connected to the common vacuum source only when in the up position.

23. The apparatus of claim 21, wherein each of said plurality of nests is disconnected when the nest is pushed downward so as to move the nest from the up position.

24. The apparatus of claim 19, wherein said fixed path is comprised of a pair of parallel rods.

25. The apparatus of claim 24, wherein the position of each of said pair of parallel rods, relative to the die feeder, is adjustable.

26. The apparatus of claim 24, further including a support member adjacent a lower surface of said rods, wherein said support member may engage the lower surface thereof to counter the deflection thereof.

27. The apparatus of claim 19, wherein said shuttle comprises:
a carriage slidably affixed to said path;
a drive system for moving said carriage along said path; and
a nest assembly operatively associated with said carriage, said nest assembly being movable in at least one direction relative to said carriage, and including a plurality of nests, each of said plurality of nests being capable of holding a die thereon.

28. The apparatus of claim 19 wherein said shuttle includes:

a carriage for translating along said path; and a nest assembly, said carriage carrying said nest assembly and said nest assembly carrying said plurality of nests, said nest assembly being disposed generally above said carriage and connected to said carriage by a plurality of pivotable links that allow said nest assembly to be elevated with respect to said carriage, at least one of said links being an extended link with a j-cam extending from its lower portion configured to engage a pin causing said extended link to rotate as said carriage travels along the path towards said presentation point, and further, the rotation of said extended pin causes said nest assembly to elevate with respect to said carriage.

* * * * *